(12) United States Patent
Ryskoski

(10) Patent No.: US 6,593,227 B1
(45) Date of Patent: Jul. 15, 2003

(54) METHOD AND APPARATUS FOR PLANARIZING SURFACES OF SEMICONDUCTOR DEVICE CONDUCTIVE LAYERS

(75) Inventor: Matthew Ryskoski, Kyle, TX (US)

(73) Assignee: Advanced Micro Devices, Inc., Austin, TX (US)

(*) Notice: Subject to any disclaimer, the term of this patent is extended or adjusted under 35 U.S.C. 154(b) by 47 days.

(21) Appl. No.: 09/851,199

(22) Filed: May 8, 2001

(51) Int. Cl.⁷ .................................. H01L 21/4763
(52) U.S. Cl. ........................... 438/631; 438/687
(58) Field of Search ..................... 117/10; 438/637, 438/655, 660–661, 672, 675, 631–633, 646, 650, 687

(56) References Cited

U.S. PATENT DOCUMENTS

| | | | | |
|---|---|---|---|---|
| 4,410,392 A | * | 10/1983 | Winter | 117/10 |
| 4,658,362 A | * | 4/1987 | Bhatt | 700/145 |
| 4,915,746 A | * | 4/1990 | Welsch | 428/661 |
| 5,976,970 A | * | 11/1999 | Dalal et al. | 438/637 |
| 6,404,053 B2 | * | 6/2002 | Givens | 257/751 |

OTHER PUBLICATIONS

D.B. Johnson, et al., "Lateral Diffusion in Ag–Se Thin–Film Couples", Journal of Applied Physics, vol. 40, No. 1, Jan. 1969, pps. 149–152.

* cited by examiner

Primary Examiner—Hoai Ho
Assistant Examiner—David Vu
(74) Attorney, Agent, or Firm—Williams, Morgan & Amerson, P.C.

(57) ABSTRACT

An apparatus and method are capable of a process to planarize a surface of a conductive layer on a semiconductor wafer. The method includes bringing a temperature of the conductive layer to within a predetermined range below a melting point of the conductive layer and holding the temperature of the conductive layer within the predetermined range to allow the conductive layer to undergo strain via at least one creep mechanism due to a weight of the conductive layer. The conductive layer is then cooled.

64 Claims, 6 Drawing Sheets

US 6,593,227 B1

METHOD AND APPARATUS FOR PLANARIZING SURFACES OF SEMICONDUCTOR DEVICE CONDUCTIVE LAYERS

BACKGROUND OF THE INVENTION

1. Field of the Invention

The present invention relates to a method and apparatus for planarizing surfaces of semiconductor device conductive layers and, in one aspect, to a method and apparatus for planarizing such layers via creep strain.

2. Description of the Related Art

Increasing chip density has placed more components on semiconductor wafer surfaces, which in turn, has decreased the area available for surface wiring. The answer to this dilemma has been multilevel metallization schemes and an increased interest in copper conductors. As each layer of copper is deposited, typically via a plating process, the wafer is polished to remove excess copper and planarize the wafer layer. The as-plated surface of the copper layer is irregular, resulting in uneven polishing material removal rates and thus varying polishing times between wafers. Economics of semiconductor device manufacturing require that processes, such as those related to wafer polishing, be continually improved to decrease cost and increase throughput.

Even after polishing, some variations exist in the as-polished surface of copper interconnects due to process variations. These variations may lead to over-polishing in some areas and underpolishing in other areas. Imprecise polishing operations can yield undesirable short circuits or open circuits, which may cause a semiconductor device to operate inconsistently, or not at all.

The present invention is directed to overcoming, or at least reducing the effects of, one or more of the problems set forth above.

SUMMARY OF THE INVENTION

In one embodiment of the present invention, an apparatus capable of a process to planarize a surface of a conductive layer on a semiconductor wafer includes a chamber, a holder for holding the semiconductor wafer, and a heating element. The holder is disposed in the chamber and the heating element is capable of heating the conductive layer. The apparatus further includes a temperature measuring element capable of measuring a temperature of the process and a controller capable of controlling the process. The apparatus also includes a heating element controller capable of controlling the heating element. The controller is interconnected with the temperature measuring element and the heating element controller.

A method according to the present invention includes bringing a temperature of the conductive layer to within a predetermined range below a melting point of the conductive layer and holding the temperature of the conductive layer within the predetermined range to allow the conductive layer to undergo strain via at least one creep mechanism due to a weight of the conductive layer. The conductive layer is then cooled.

BRIEF DESCRIPTION OF THE DRAWINGS

The invention may be understood by reference to the following description taken in conjunction with the accompanying drawings, in which like reference numerals identify like elements, and in which.

Figure 1:
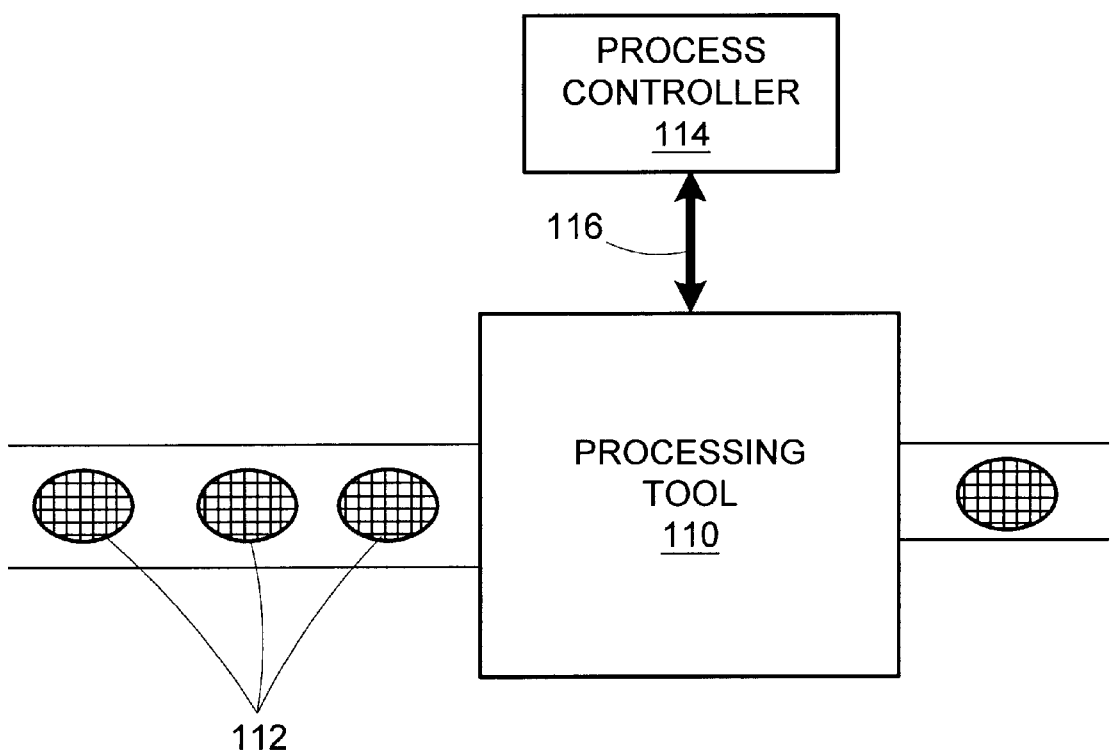
FIG. 1 is a block diagram of a system according to the present invention.

While the invention is susceptible to various modifications and alternative forms, specific embodiments thereof have been shown by way of example in the drawings, and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

Referring to FIG. 1, an exemplary system according to the present invention including a processing tool 110 is shown. The processing tool 110 may be used as one part of an elaborate fabrication process to manufacture semiconductor wafers 112 into functional semiconductor devices. The processing tool 110 may be controlled by a process controller 114 that may send a plurality of control signals to the processing tool 110 on a control-line 116. The process controller 114 may be comprised of a variety of devices. For example, in one embodiment, the process controller 114 may be a controller embedded inside the processing tool 110 and communicate with the processing tool 110 using protocols and interfaces provided by the manufacturer. Alternatively, the process controller 114 may be connected to a larger network of controllers and communicate with the processing tool 110 through an Advanced Process Control (APC) framework interface. For example, the processing tool 110 may be coupled to an equipment interface (not shown) that retrieves various operational data from the processing tool 110 and communicates this data to the APC framework to determine whether the processing tool 110 is experiencing a faulty operation or, as will be described below, whether the processing tool 110 is operating as expected within a predefined state. The equipment interface may receive control signals from the APC framework that may be used to control the processing tool 110. For example, the control signal from the APC framework may be used to shut down the processing tool 110 if the tool state data (e.g., qualification data) that was sent by the equipment interface was deemed faulty by the APC framework.

The semiconductor wafers 112 are generally processed in batches, which are commonly referred to as lots or batch processing. For example, a lot of semiconductor wafers 112 may be comprised of 25 of the semiconductor wafers 112. The semiconductor wafers 112 within a lot progress through the manufacturing process together in an attempt to subject the semiconductor wafers 112 to substantially the same manufacturing conditions, such that the resulting semiconductor devices have substantially the same performance characteristics (e.g., speed, power, etc.) Generally, when the processing tool 110 permits, a lot of semiconductor wafers 112 is processed simultaneously, and the semiconductor wafers 112 within the lot are subjected to substantially the same manufacturing conditions. However, a variety of processing tools 110 process the semiconductor wafers 112 individually. For example, rather than simultaneously processing all the semiconductor wafers 112 in a lot, each semiconductor wafer 112 is successively and individually processed.

Figure 2:
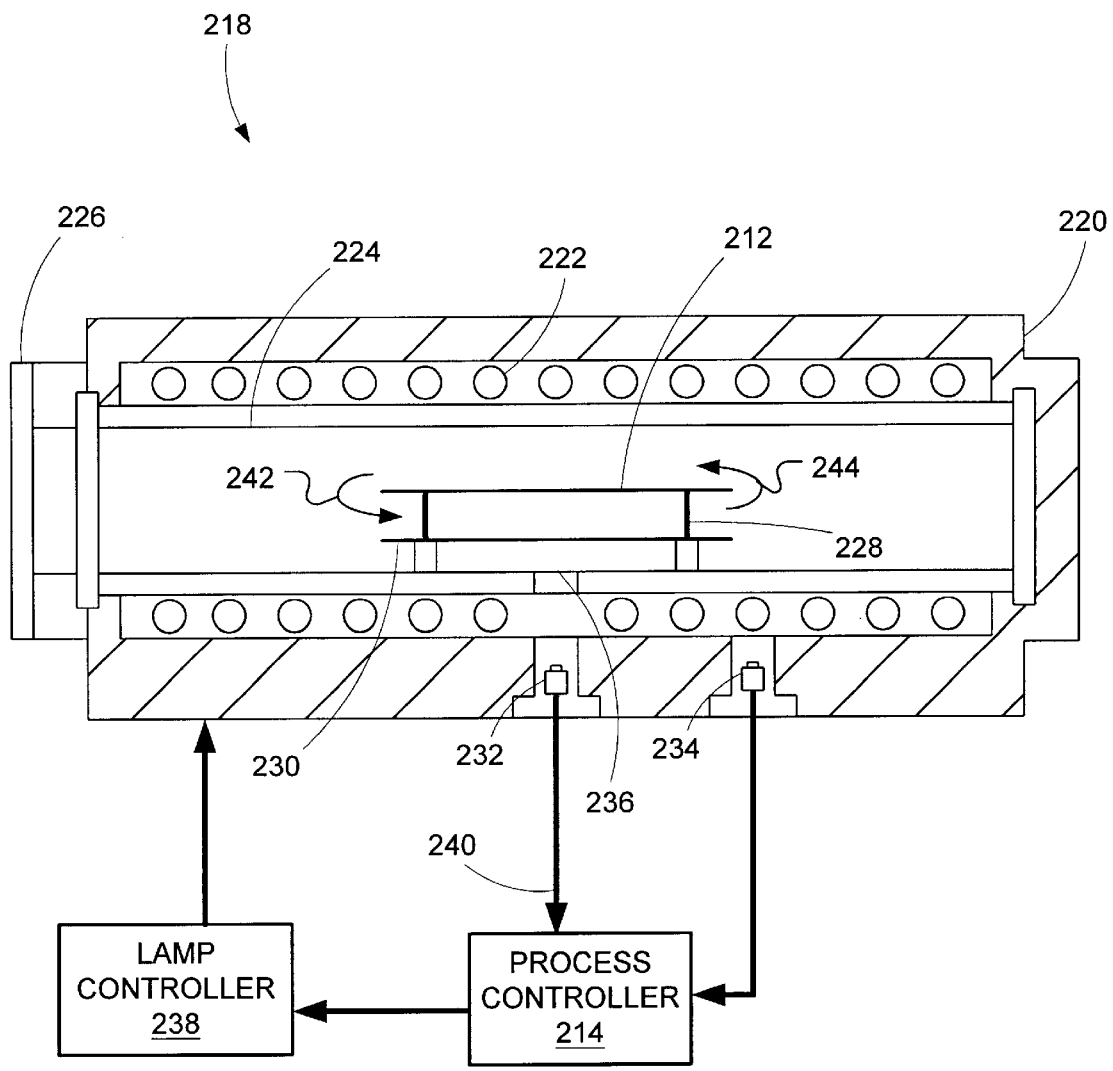
FIG. 2 is a cross-sectional view of an apparatus according to the present invention.

Referring to FIG. 2, a stylized cross-sectional view of an exemplary processing tool 218 is shown. In this illustrative embodiment, the processing tool 218 is used for planarizing surfaces of conductive layers on the semiconductor wafers 212. The processing tool 218 may be comprised of a reactor block 220, heating elements 222, a reactor chamber 224, and a reactor chamber door 226. The heating elements 222 may be positioned adjacent the reactor block 220 and may be comprised of a variety of devices, such as tungsten halogen lamps. Generally, the present method comprises quickly increasing the surface temperature of a conductive layer on a semiconductor wafer 212 for short periods of time.: Further, the processing tool 218 can further comprise a turntable (not shown) for spinning, the semiconductor wafer 212 about a central axis of the semiconductor wafer 212 that is generally perpendicular to a top surface of the semiconductor wafer 212, as indicated by the arrows 242 and 244. The heating elements 222 may be used to provide heat to the reactor chamber 224. For example, in one embodiment the heating elements 222 provide heat in the form of radiation. Moreover, each heating element 222 may be independently and dynamically controlled to provide uniform and precise heating to the semiconductor wafer 212 using radiation that passes through the reaction chamber 224.

The reactor chamber 224 separates the semiconductor wafer 212 from the heating elements 222 and the reactor block 220, thus, providing a tightly controlled processing environment while minimizing the amount of contamination to which the semiconductor wafer 212 is exposed. The reactor chamber 224 may be accessed through the reactor chamber door 226. As described above, the processing tool 218 may process each semiconductor wafer 212 individually, and in this embodiment, each semiconductor wafer 212 in a lot may be individually loaded into the processing tool 218, processed, and extracted from the processing tool 218 through the reactor chamber door 226. The atmosphere within the reactor chamber 224 can comprise an inert gas or any other atmosphere suitable for the process being performed.

The semiconductor wafer 212 is processed inside the reactor chamber 224 and is positioned on quartz pins 228 attached to a quartz wafer tray (not shown), which resides inside the reactor chamber 224. A permanent wafer 230 (e.g., a silicon nitride-coated silicon wafer) may be positioned underneath the semiconductor wafer 212. As will be discussed below, the permanent wafer 230 ensures that the temperature of the semiconductor wafer 212 is measured accurately. A variety of parameters (e.g., various tool state data) of the processing tool 218 may be monitored to determine the current state of the processing tool 218.

Moreover, a variety of sensors and devices may be used to extract the data, and this data may be sent to the process controller 214. In one illustrative embodiment, a first and second pyrometer 232, 234 are shown positioned within the reactor block 220. The first pyrometer 232 may be used to measure the temperature of the semiconductor wafer 212 or the permanent wafer 230, and the second pyrometer 234 may be used to measure the temperature of the reactor chamber 224. Those skilled in the art will appreciate that the pyrometers 232, 234 are non-intrusive measuring devices that do not contact the semiconductor wafer 212 or the reactor chamber 224. Rather, the pyrometers 232, 234 are optical instruments that measure temperature by light input. Once calibrated, the pyrometers 232, 234 deliver an electrical signal that correlates with the amount of light intensity that enters it, which correlates with the temperature of the object the pyrometers 232, 234 view.

The first pyrometer 232 measures the temperature of the semiconductor wafer 212 through a window 236. The window 236 permits the first pyrometer 232 to "look" into the reactor chamber 224 and determine the temperature of the semiconductor wafer 212 from the permanent wafer 230. If the permanent wafer 230 was not used, the first pyrometer 232 may give false temperature measurements because the backside film layer of the semiconductor wafer 212 may vary depending upon the process, and the various film layers each give off different emissions in response to temperature. Because the coating of the permanent wafer 230 remains the same, the first pyrometer 232 may be calibrated with its emitted radiation. The second pyrometer 234 operates in substantially the same manner but operates to measure the temperature of the reactor chamber 224. For example, the second pyrometer 234 is directed at an outer surface of the reactor chamber 224.

Although only two pyrometers 232, 234 are shown, those skilled in the art will appreciate that a plurality of pyrometers 232, 234 may be used to determine the temperature of the semiconductor wafer 212 and reactor chamber 224. Moreover, rather than using the pyrometers 232, 234, any other measuring device may be used, such as a thermocouple. Furthermore, the number and particular type of measuring devices may vary, depending upon the application.

In one embodiment, a lamp controller 238 may be used to drive the heating elements 222 during operation of the processing tool 218. Generally, for a particular process, a specific operating temperature may be desired. With this in mind, the process controller 214 may receive temperature measurements (e.g., tool state data) from the first and second pyrometers 232, 234 over data lines 240. Based on the tool state data, the process controller 214 may direct the lamp controller 238 to increase or decrease the power supplied to the heating elements 222. For example, if the temperature inside the reactor chamber 224 needs to be increased, more power may be supplied to the heating elements 222. Likewise, if the temperature inside the reactor chamber 224 needs to be decreased, the power supplied to the heating elements 222 may be reduced.

In one embodiment, power consumption of the heating elements 222 may be monitored by the process controller 214 and included in the tool state data of the processing tool 218. For example, when power is supplied to the heating elements 222 (e.g., during pre-heat, normal operation, etc.), the process controller 214 may determine whether the processing tool 218 is operating at 50%, 75%, or any other percentage of full power. Alternatively, the process controller 214 may monitor power consumption of the processing tool 218 in terms of watts. In one embodiment, during operation of the processing tool 210, the power consumption of heating elements 222 may be sent to a data output device (not shown), such as a display, a data file, and the like.

In addition to power consumption, the tool state data may include incremental changes, such as increases or decreases, in the power supplied to the heating elements 222. As described above, to maintain a desired operating temperature, the process controller 214 may direct the lamp controller 238 to increase or decrease the power supplied to the heating elements 222. These incremental changes may be monitored by the process controller 214 and included in the tool state data of the processing tool 218.

The present invention also includes a method for planarizing surfaces of semiconductor device conductive layers by bringing the conductive layer to a temperature within a predetermined range below an approximate melting point of the conductive layer. The temperature of the conductive layer is held within the predetermined range for a sufficient length of time to allow the conductive layer to undergo strain via at least one creep mechanism due to a weight of the conductive layer. This process can be augmented by spinning the conductive layer, as indicated in FIG. 2. The conductive layer is then cooled. Under stresses less than their yield stresses, metals display a slow plastic flow, known as creep, resulting from the action of two processes that generally will both be in operation: grain-boundary sliding and the movement of dislocations past obstacles by climb. Both processes depend on thermally-activated atomic mobility, which can be described according to the function:

$$\tau = f\left(\frac{T}{T_m}\right)$$

wherein:
  τ=the time between successive atomic jumps;
  T=the temperature of the metal;
  and
  $T_m$=the melting temperature of the metal.
Calculated values of τ, which apply to virtually all metals, are shown in Table 1:

TABLE 1

| $\frac{T}{T_m}$ | 0.1 | 0.2 | 0.3 | 0.4 | 0.5 | 0.6 | 0.7 | 0.8 | 0.9 |
|---|---|---|---|---|---|---|---|---|---|
| τ(sec) | $10^{66}$ | $10^{25}$ | $10^{11}$ | $10^4$ | 10 | $10^{-2}$ | $10^{-4}$ | $10^{-6}$ | $10^{-7}$ |

Structure and Properties of Engineering Materials, Brick, Robert M. et al, 1977, 2456

Figure 3:
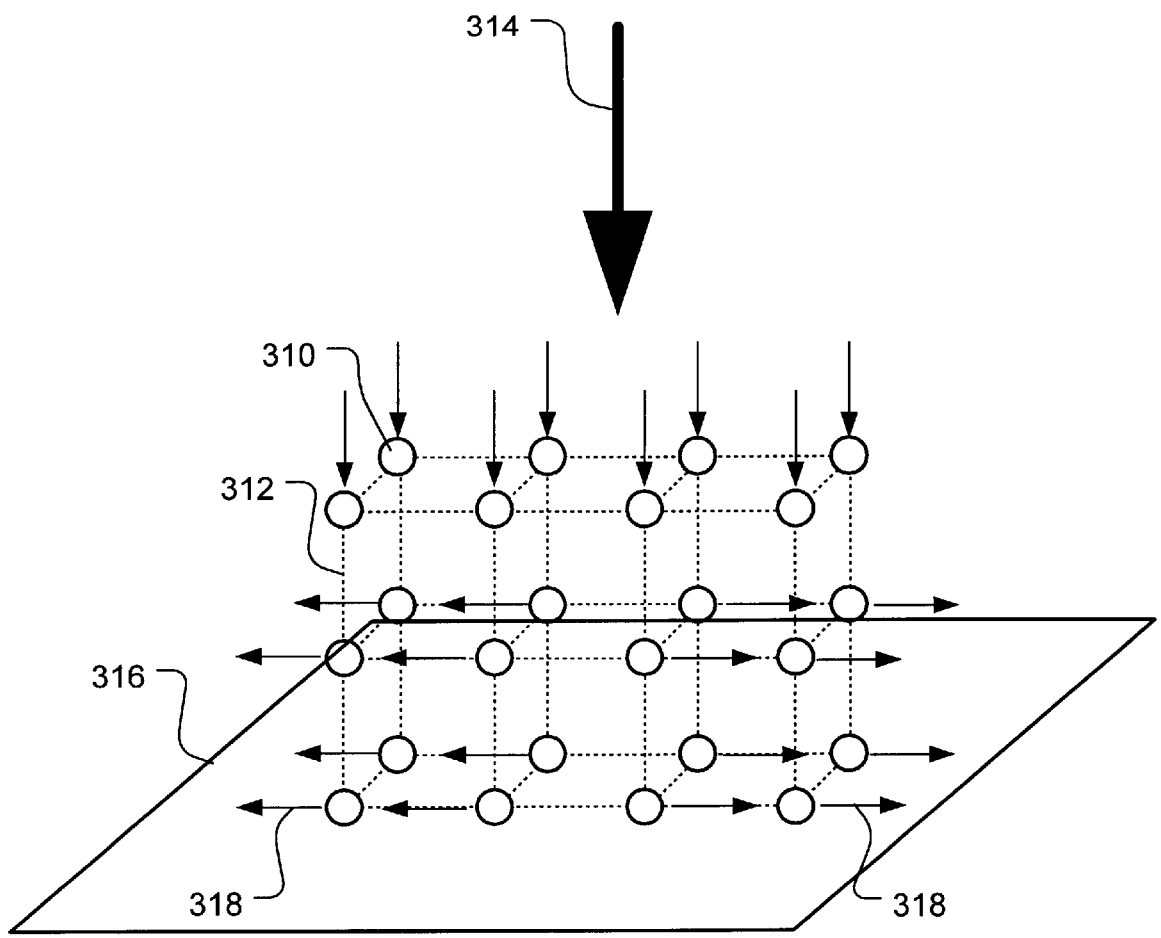
FIG. 3 is a diagram of atomic mobility in a crystal lattice structure.

Referring now to FIG. 3, at very low temperatures, atoms 310 (only one of which is labeled) can be regarded as permanently fixed in their places in a crystal lattice 312, while, when the melting temperature is approached, the atoms change places with one another very rapidly. Thus, the atoms 310, which are constantly under a gravitational force 314, have the mobility to move from their positions in the crystal lattice 312 at elevated temperatures. The atoms 310 can move downwardly only to a certain extent due to an underlying process layer 316; they must then move outwardly, as indicated by arrows 318 (only two of which are labeled). This outward movement can be augmented by spinning the material, since inertia urges the atoms 310 outwardly. As the atoms 310 flow outwardly, do atoms in lattice locations in ridges in the conductive layer move to lattice locations in valleys. Thus, the ridges are planarized and the valleys are filled. The data in Table 1 describes atomic mobility within grains themselves; at the grain boundaries, atomic mobility is much greater. Under stress at moderate or high temperatures, a metal deforms by grain-boundary sliding due to viscous flow at the grain boundaries. This is one mechanism of creep strain.

Figure 4:
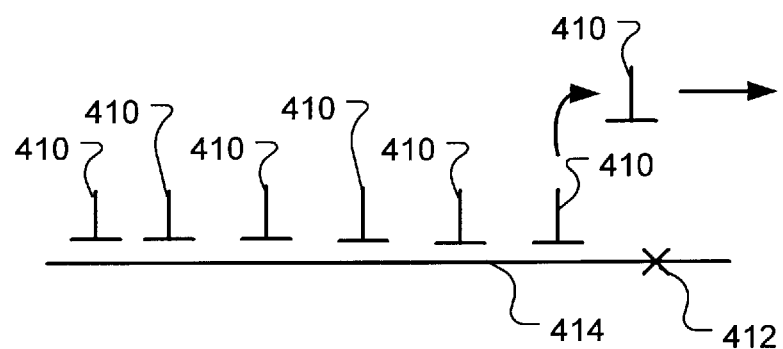
FIG. 4 is a diagram of dislocation climb.

If applied stress on a metal is less than the yield stress, then its dislocations are likely to not be set in motion when the metal is at a low temperature. Higher temperatures thermally activate atomic mobility, which aid dislocations in moving past barriers that they otherwise would not be able to overcome. FIG. 4 illustrates this mechanism, known as dislocation climb. Dislocations 410 are piled up at a barrier 412 on a slip plane 414. At lower temperatures, the applied stress is not sufficient to allow the dislocations 410 to pass the barrier 412. If the atomic mobility is great enough, as illustrated in Table 1, vacancies can diffuse to the extra half plane of the dislocation 410 until one row of atoms is displaced. The dislocation 410 then terminates on the next slip plane above and is free to move on. Accordingly, as T approaches $T_m$, it becomes more and more difficult for a metal to show any true rigidity.

The present invention will now be described with reference to FIGS. 5A–5E. Although the various regions and structures of a semiconductor device are depicted in the drawings as having very precise, sharp configurations and profiles, those skilled in the art will recognize that, in reality, these regions are not as precise as indicated in the drawings. Additionally, the relative sizes of the various features depicted in the drawings may be exaggerated or reduced as compared to the size of those features in fabricated devices. Nevertheless, the attached drawings are included to describe and explain illustrative examples of the present invention.

Figure 5A:
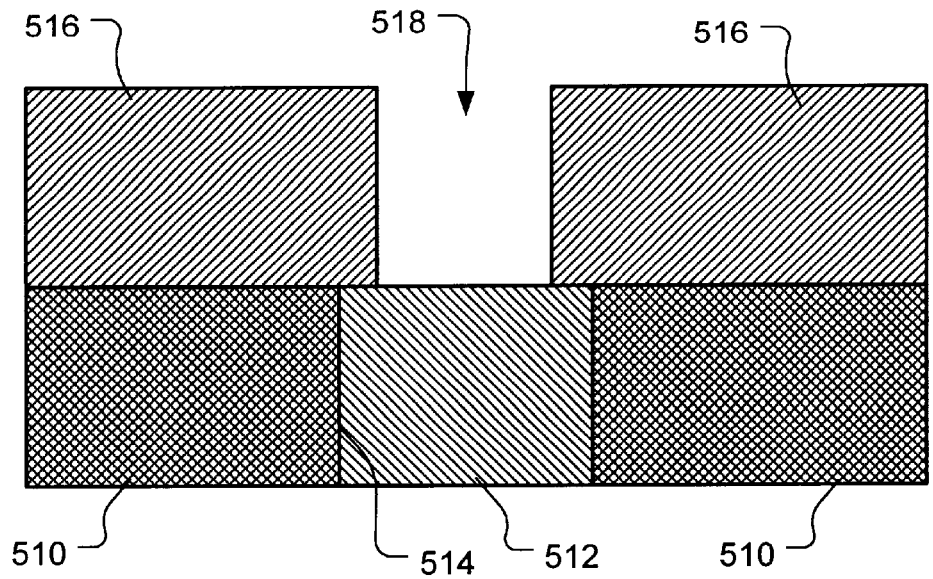
FIGS. 5A–5E depict an illustrative process flow for planarizing surfaces of semiconductor device layers according to the present invention.
Figure 5B:
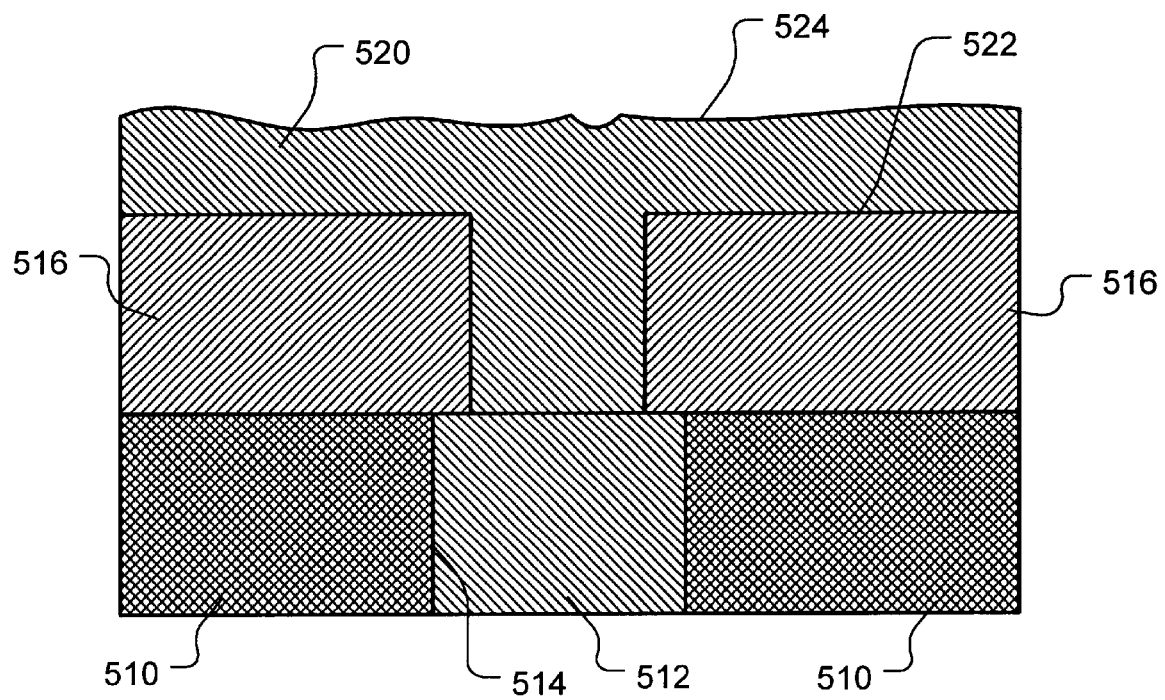
Figure 5C:
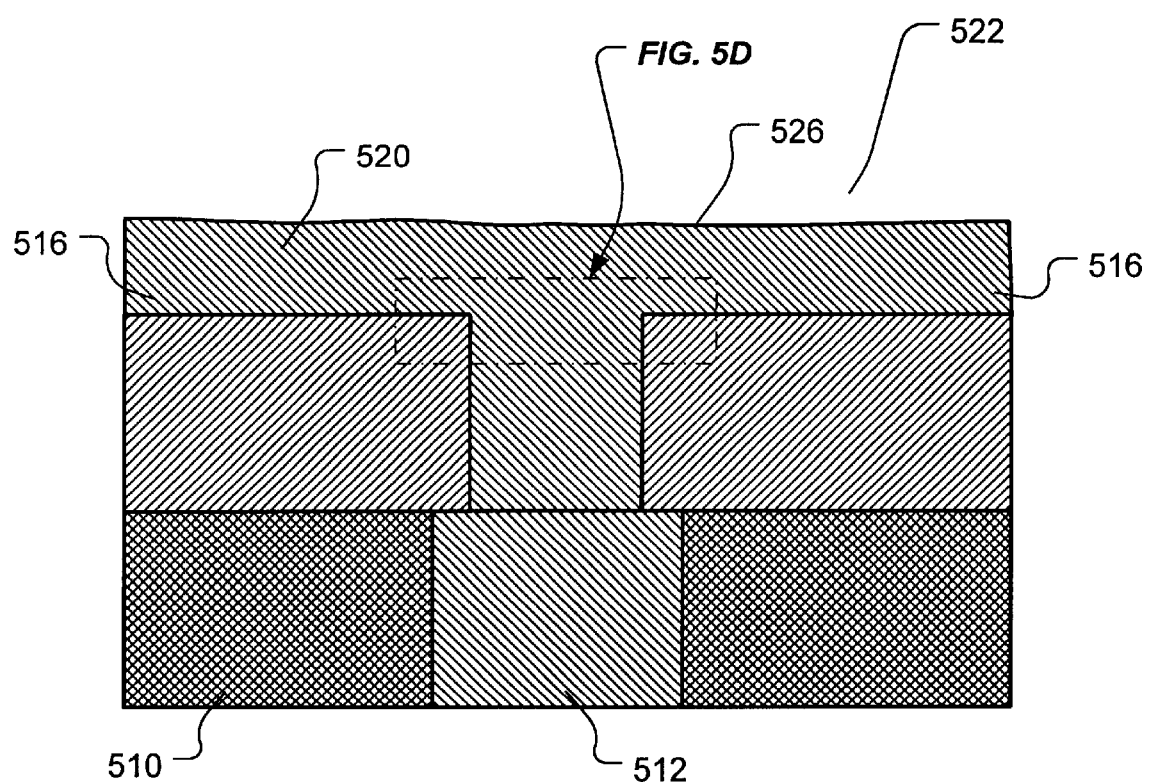

As shown in FIG. 5A, a first insulating layer 510 is formed above a semiconductor substrate (not shown), and a conductive metal line 512 comprised of copper is formed in an opening 514 in the first insulating layer 510. Thereafter, a second insulating layer 516 is formed above the first insulating layer 510, and an opening 518 is formed therein. Referring now to FIG. 5B, a copper layer 520 is formed in the opening 518 and above the surface 522 of the second insulating layer 516. The surface 524 of the copper layer 520, in the as-deposited state, is irregular due to the deposition process. Typically, a chemical mechanical planarization (CMP) process is performed on the built-up wafer to remove portions of the copper layer 520 lying outside of the opening 518. The varying height of the surface 524 can cause variations in the CMP process due to non-uniform material removal rates. Accordingly, in one embodiment of the present invention, the copper layer 520 is brought to a temperature within a predetermined range below its melting point. The temperature of the copper layer 520 is held within the predetermined range to allow the copper layer 520 to undergo at least one creep mechanism due to its weight to increase its thickness uniformity, as illustrated in FIG. 5C. As described previously, the copper layer 520 can be spun to augment weight-induced creep. As can be seen, the reformed surface 526 is flatter than the previous surface 524. Thus, the following CMP process can be conducted in a more uniform manner.

In one embodiment, the temperature of the copper layer 520 is not less than about 50% of its melting point and the temperature is not greater than its melting point. In another embodiment, the temperature of the copper layer 520 is not less than about 80% of its melting point and the temperature is not greater than its melting point. Grain-boundary sliding or dislocation climb can be the creep mechanism in play, or a combination of both grain-boundary sliding and dislocation climb can be at work. In one embodiment, the temperature of the copper layer 520 is held within the predetermined range for a length of time sufficient to planarize the surface of the conductive layer 520 to within a predetermined tolerance. In a further embodiment, the temperature of the copper layer 520 is held for a predetermined length of time such that grains in the copper layer 520 do not exceed a desired size. The copper layer 520 is then cooled. The copper layer 520 can be cooled at a predetermined rate to regulate grain growth. In one embodiment, the copper layer 520 is cooled slowly to minimize grain growth. In one embodiment, the copper layer 520 is heated with a radiant heat source, e.g., the heating elements 222, shown in FIG. 2, which can be tungsten halogen lamps. One embodiment of the present invention provides for the method to be conducted in an inert atmosphere (e.g., an argon gas atmosphere) to inhibit oxidation of the copper layer 520.

Figure 5D:
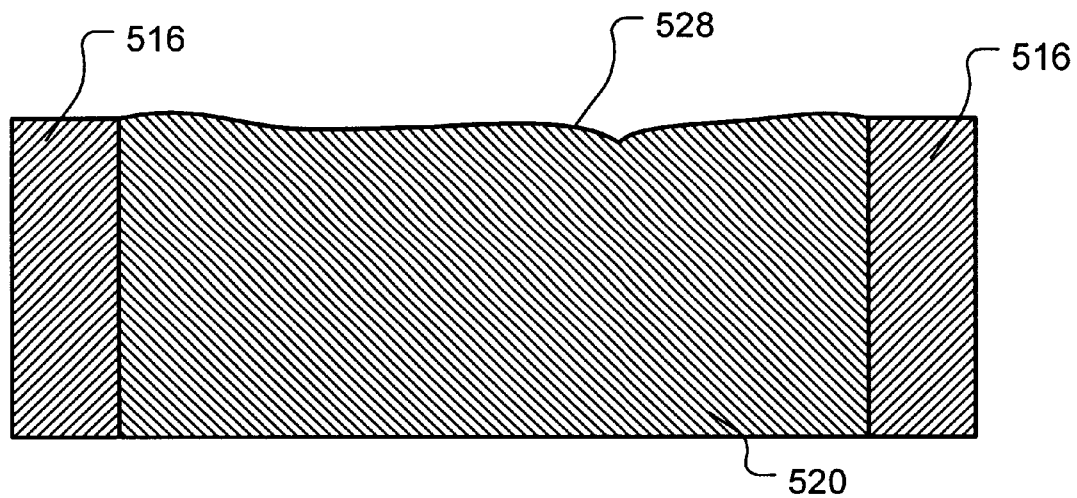
Figure 5E:
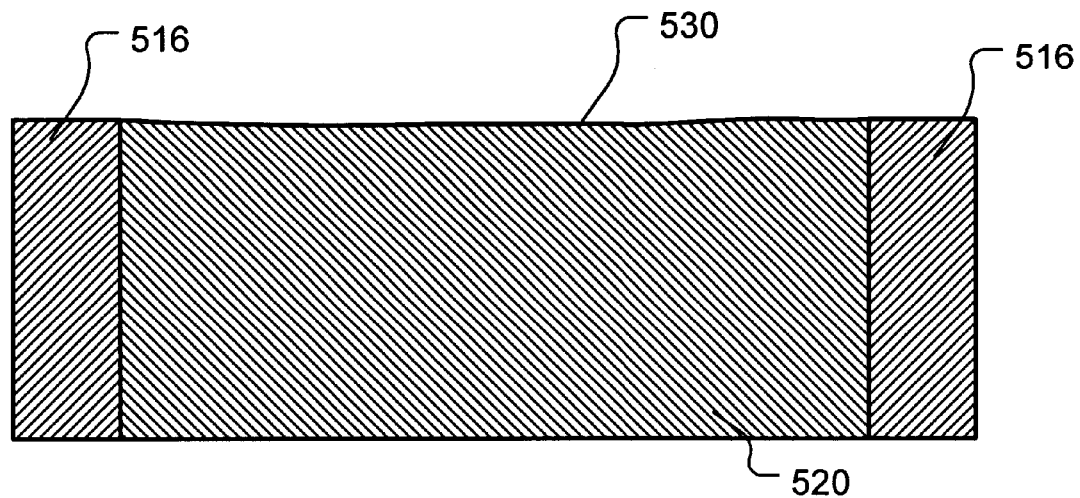

The present invention can be useful either before or after the CMP process, or it can be used both before and after the CMP process. Referring now to FIG. 5D, a portion of the semiconductor device, as annotated in FIG. 5C, is illustrated but in a condition typical to that found after a CMP process. The surface 528, while much flatter than the surface 524 (FIG. 5A), still has variations that can impede interconnection or otherwise degrade the operation of the semiconductor device. Thus, in the same way, the present invention can be performed after the CMP process to further improve the thickness uniformity of the copper layer 520, resulting in a flatter reformed surface 530, as shown in FIG. 5E.

The present invention further encompasses an apparatus having means for performing the embodiments of the method of the invention described herein and their equivalents.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method capable of planarizing a surface of a conductive layer of a semiconductor device, comprising:
   bringing a temperature of the conductive layer to within a predetermined range below a melting point of the conductive layer;
   holding the temperature of the conductive layer within the predetermined range to allow the conductive layer to undergo strain via at least one creep mechanism due to a weight of the conductive layer; and
   cooling the conductive layer.

2. A method, according to claim 1, wherein holding the temperature of the conductive layer further comprises holding the temperature of the conductive layer within the predetermined range for a length of time sufficient to planarize the surface of the conductive layer to within a predetermined tolerance.

3. A method, according to claim 1, wherein bringing the temperature of the conductive layer to within the predetermined range further comprises bringing the temperature of the conductive layer to a temperature in a range from about 50% of a melting temperature of the conductive layer to about the melting point of the conductive layer.

4. A method, according to claim 1, wherein bringing the temperature of the conductive layer to within the predetermined range further comprises bringing the temperature of the conductive layer to a temperature in a range from about 80% of a melting temperature of the conductive layer to about the melting point of the conductive layer.

5. A method, according to claim 1, wherein holding the temperature of the conductive layer further comprises holding the temperature of the conductive layer at a level sufficient to cause grain-boundary sliding.

6. A method, according to claim 1, wherein holding the temperature of the conductive layer further comprises holding the temperature of the conductive layer at a level sufficient to cause dislocation climb.

7. A method, according to claim 1, wherein cooling the conductive layer further comprises cooling the conductive layer at a predetermined rate.

8. A method, according to claim 1, wherein bringing the temperature of the conductive layer to within the predetermined range further comprises heating the conductive layer with a radiant heat source.

9. A method, according to claim 1, further comprising introducing an inert atmosphere in a region about the semiconductor device.

10. A method, according to claim 1, further comprising spinning the conductive layer.

11. A method capable of use in a semiconductor wafer manufacturing operation, comprising:
    depositing a conductive layer;
    bringing a temperature of the conductive layer to within a predetermined range below an approximate melting point of the conductive layer;
    holding the temperature of the conductive layer within the predetermined range to allow the conductive layer to undergo strain via at least one creep mechanism due to a weight of the conductive layer;
    cooling the conductive layer; and
    planarizing the conductive layer.

12. A method, according to claim 11, wherein holding the temperature of the conductive layer further comprises holding the temperature of the conductive layer within the predetermined range for a length of time sufficient to planarize the surface of the conductive layer to within a predetermined tolerance.

13. A method, according to claim 11, wherein bringing the temperature of the conductive layer to within the predetermined range further comprises bringing the temperature of the conductive layer to a temperature in a range from about 50% of a melting temperature of the conductive layer to about the melting point of the conductive layer.

14. A method, according to claim 11, wherein bringing the temperature of the conductive layer to within the predetermined range further comprises bringing the temperature of the conductive layer to a temperature in a range from about 80% of a melting temperature of the conductive layer to about the melting point of the conductive layer.

15. A method, according to claim 11, wherein holding the temperature of the conductive layer further comprises holding the temperature of the conductive layer at a level sufficient to cause grain-boundary sliding.

16. A method, according to claim 11, wherein holding the temperature of the conductive layer further comprises holding the temperature of the conductive layer at a level sufficient to cause dislocation climb.

17. A method, according to claim 11, wherein cooling the conductive layer further comprises cooling the conductive layer at a predetermined rate.

18. A method, according to claim 11, wherein bringing the temperature of the conductive layer to within the predetermined range further comprises heating the conductive layer with a radiant heat source.

19. A method, according to claim 11, wherein introducing an inert atmosphere in a region about the semiconductor device.

20. A method, according to claim 11, wherein depositing the conductive layer further comprises plating the conductive layer.

21. A method, according to claim 11, wherein planarizing the conductive layer further comprises planarizing the conductive layer using a chemical mechanical polishing process.

22. A method, according to claim 11, further comprising spinning the conductive layer.

23. A method capable of use in a semiconductor wafer manufacturing operation, comprising:
   depositing a conductive layer;
   planarizing the conductive layer;
   bringing a temperature of a planarized conductive layer to within a predetermined range below a melting point of the conductive layer;
   holding the temperature of the planarized conductive layer within the predetermined range to allow the conductive layer to undergo strain via at least one creep mechanism due to a weight of the conductive layer; and
   cooling the planarized conductive layer.

24. A method, according to claim 23, wherein holding the temperature of the conductive layer further comprises holding the temperature of the conductive layer within the predetermined range for a length of time sufficient to planarize a surface of the conductive layer to within a predetermined tolerance.

25. A method, according to claim 23, wherein bringing the temperature of the conductive layer to within the predetermined range further comprises bringing the temperature of the conductive layer to a temperature in a range from about 50% of the melting temperature of the conductive layer to about the melting point of the conductive layer.

26. A method, according to claim 23, wherein bringing the temperature of the conductive layer to within the predetermined range further comprises bringing the temperature of the conductive layer to a temperature in a range from about 80% of the melting temperature of the conductive layer to about the melting point of the conductive layer.

27. A method, according to claim 23, wherein holding the temperature of the conductive layer further comprises holding the temperature of the conductive layer at a level sufficient to cause grain-boundary sliding.

28. A method, according to claim 23, wherein holding the temperature of the conductive layer further comprises holding the temperature of the conductive layer at a level sufficient to cause dislocation climb.

29. A method, according to claim 23, wherein cooling the planarized conductive layer further comprises cooling the planarized conductive layer at a predetermined rate.

30. A method, according to claim 23, wherein bringing the temperature of the planarized conductive layer to within the predetermined range further comprises heating the planarized conductive layer with a radiant heat source.

31. A method, according to claim 23, further comprising introducing an inert atmosphere in a region about the semiconductor device.

32. A method, according to claim 23, wherein depositing the conductive, layer further comprises plating the conductive layer.

33. A method, according to claim 23, wherein planarizing the conductive layer further comprises planarizing the conductive layer using a chemical mechanical polishing process.

34. A method, according to claim 23, further comprising:
   bringing a temperature of the conductive layer, prior to planarizing the conductive layer, to within a predetermined range below an approximate melting point of the conductive layer;
   holding the temperature of the conductive layer, prior to planarizing the conductive layer, within the predetermined range to allow the conductive layer to undergo strain via at least one creep mechanism due to a weight of the conductive layer;
   cooling the conductive layer prior to planarizing the conductive layer.

35. A method, according to claim 34, wherein holding the temperature of the conductive layer further comprises holding the temperature of the conductive layer within the predetermined range for a length of time sufficient to planarize a surface of the conductive layer to within a predetermined tolerance.

36. A method, according to claim 34, wherein bringing the temperature of the conductive layer to within the predetermined range further comprises bringing the temperature of the conductive layer to a temperature in a range from about 50% of the melting temperature of the conductive layer to about the melting point of the conductive layer.

37. A method, according to claim 34, wherein bringing the temperature of the conductive layer to within the predetermined range further comprises bringing the temperature of the conductive layer to a temperature in a range from about 80% of the melting temperature of the conductive layer to about the melting point of the conductive layer.

38. A method, according to claim 34, wherein holding the temperature of the conductive layer further comprises holding the temperature of the conductive layer at a level sufficient to cause grain-boundary sliding.

39. A method, according to claim 34, wherein holding the temperature of the conductive layer further comprises holding the temperature of the conductive layer at a level sufficient to cause dislocation climb.

40. A method, according to claim 34, wherein cooling the conductive layer further comprises cooling the conductive layer at the predetermined rate.

41. A method, according to claim 34, wherein bringing the temperature of the conductive layer to within the predetermined range further comprises heating the conductive layer with a radiant heat source.

42. A method, according to claim 34, further comprising introducing an inert atmosphere in a region about the semiconductor device.

43. A method, according to claim 34, further comprising spinning the conductive layer.

44. A method, according to claim 23, further comprising spinning the conductive layer.

45. An apparatus capable of planarizing a surface of a conductive layer of a semiconductor device, comprising:
   means for bringing a temperature of the conductive layer to within a predetermined range below an approximate melting point of the conductive layer;
   means for holding the temperature of the conductive layer within the predetermined range to allow the conductive layer to undergo strain via at least one creep mechanism due to a weight of the conductive layer; and
   means for cooling the conductive layer.

46. An apparatus, according to claim 45, wherein the means for cooling the conductive layer further comprises means for cooling the conductive layer at a predetermined rate.

47. An apparatus, according to claim 45, wherein the apparatus is capable of introducing an inert atmosphere in a region about the semiconductor device.

48. An apparatus, according to claim 45, further comprising means for spinning the conductive layer.

49. An apparatus capable of use in a semiconductor wafer manufacturing operation, comprising:
- means for depositing a conductive layer;
- means for bringing a temperature of the conductive layer to within a predetermined range below an approximate melting point of the conductive layer;
- means for holding the temperature of the conductive layer within the predetermined range to allow the conductive layer to undergo strain via at least one creep mechanism due to a weight of the conductive layer;
- means for cooling the conductive layer; and
- means for planarizing the conductive layer.

50. An apparatus, according to claim 49, wherein the means for cooling the conductive layer further comprises means for cooling the conductive layer at a predetermined rate.

51. An apparatus, according to claim 49, wherein the apparatus is capable of introducing an inert atmosphere in a region about the semiconductor device.

52. An apparatus, according to claim 49, wherein the means for depositing the conductive layer further comprises means for plating the conductive layer.

53. An apparatus, according to claim 49, wherein the means for planarizing the conductive layer further comprises means for planarizing the conductive layer using a chemical mechanical polishing process.

54. An apparatus, according to claim 49, further comprising means for spinning the conductive layer.

55. An apparatus capable of use in a semiconductor wafer manufacturing operation, comprising:
- means for depositing a conductive layer;
- means for planarizing the conductive layer;
- means for bringing a temperature of the planarized conductive layer to within a predetermined range below an approximate melting point of the conductive layer;
- means for holding the temperature of the planarized conductive layer within the predetermined range to allow the conductive layer to undergo strain via at least one creep mechanism due to a weight of the conductive layer; and
- means for cooling the planarized conductive layer.

56. An apparatus, according to claim 55, wherein the means for cooling the planarized conductive layer further comprises means for cooling the planarized conductive layer at a predetermined rate.

57. An apparatus, according to claim 55, wherein the apparatus is capable of introducing an inert atmosphere in a region about the semiconductor device.

58. An apparatus, according to claim 55, wherein the means for depositing the conductive layer further comprises means for plating the conductive layer.

59. An apparatus, according to claim 55, wherein the means for planarizing the conductive layer further comprises means for planarizing the conductive layer using a chemical mechanical polishing process.

60. An apparatus, according to claim 55, further comprising means for spinning the conductive layer.

61. An apparatus, according to claim 55, further comprising:
- means for bringing the temperature of the conductive layer, prior to planarizing the conductive layer, to within the predetermined range below the approximate melting point of the conductive layer;
- means for holding the temperature of the conductive layer, prior to planarizing the conductive layer, to within the predetermined range to allow the conductive layer to undergo strain via at least one creep mechanism due to the weight of the conductive layer;
- means for cooling the conductive layer prior to planarizing the conductive layer.

62. An apparatus, according to claim 55, wherein the means for cooling the conductive layer further comprises means for cooling the conductive layer at the predetermined rate.

63. An apparatus, according to claim 55, wherein the apparatus is capable of introducing an inert atmosphere in a region about the semiconductor device.

64. An apparatus, according to claim 55, further comprising means for spinning the conductive layer.

* * * * *